US012765242B2

(12) United States Patent
Zuo

(10) Patent No.: US 12,765,242 B2
(45) Date of Patent: Oct. 13, 2026

(54) DISPLAY PANEL WITH INSULATOR LAYERS

(71) Applicant: WUHAN CHINA STAR OPTOELECTRONICS TECHNOLOGY CO., LTD., Wuhan (CN)

(72) Inventor: Xiang Zuo, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 280 days.

(21) Appl. No.: 18/565,693

(22) PCT Filed: Oct. 12, 2023

(86) PCT No.: PCT/CN2023/124191
§ 371 (c)(1),
(2) Date: Nov. 30, 2023

(87) PCT Pub. No.: WO2025/050465
PCT Pub. Date: Mar. 13, 2025

(65) Prior Publication Data
US 2025/0107412 A1 Mar. 27, 2025

(30) Foreign Application Priority Data
Sep. 8, 2023 (CN) ........................ 202311163435.3

(51) Int. Cl.
*H10K 59/80* (2023.01)
*H10K 59/40* (2023.01)
*H10K 102/00* (2023.01)

(52) U.S. Cl.
CPC ........... *H10K 59/879* (2023.02); *H10K 59/40* (2023.02); *H10K 59/873* (2023.02); *H10K 2102/351* (2023.02)

(58) Field of Classification Search
CPC .. H10K 59/879; H10K 59/40; H10K 59/8731; H10K 59/50; H10K 59/124
See application file for complete search history.

(56) References Cited

U.S. PATENT DOCUMENTS

2023/0076282 A1* 3/2023 Cai ........................ H10K 59/38
2024/0292704 A1* 8/2024 Zeng ........................ H10K 59/38
2024/0413263 A1* 12/2024 Yueh ........................ H10H 20/01

FOREIGN PATENT DOCUMENTS

CN 113451383 A * 9/2021 ........... H10K 59/791
CN 115440913 A * 12/2022 ........... H10K 59/873

* cited by examiner

*Primary Examiner* — Mamadou L Diallo
(74) *Attorney, Agent, or Firm* — PV IP PC; Peter Stecher; Wei Te Chung

(57) ABSTRACT

The embodiments of the present disclosure are directed to a display panel, which includes a substrate, a light-emitting layer, an insulation layer, and a flat layer. The insulation layer includes a plurality of convex portions corresponding to a pixel unit and a plurality of grooves disposed between adjacent convex portions. The insulation layer comprises a first insulator layer and a second insulator layer, and each of the convex portions comprises a first convex portion corresponding to the first insulator layer and a second convex portion corresponding to the second insulator layer, a roughness of a side wall of the groove corresponding to the first convex portion is greater than a roughness of a side wall of the groove corresponding to the second convex portion

20 Claims, 3 Drawing Sheets

DISPLAY PANEL WITH INSULATOR LAYERS

CROSS REFERENCE TO RELATED APPLICATIONS

This application is a US national phase application based upon an International Application No. PCT/CN2023/124191, filed on Oct. 12, 2023, which claims the priority of Chinese Patent Application No. 202311163435.3, entitled "DISPLAY PANEL", filed on Sep. 8, 2023, the disclosures of which are incorporated herein by reference in its entirety.

FIELD OF THE INVENTION

The present disclosure relates to the field of display, more particularly, to a display panel.

BACKGROUND

Organic light emitting diodes (OLEDs) display panels have high luminous efficiency, and fast response speed, and can be made on flexible substrates. They have advantages such as anti-bending and wide viewing angle and are loved by a large number of users. To improve the light output efficiency of OLED display panels, micro lens structures are usually used for light extraction. However, the existing micro lens structures have limited improvement in the light output efficiency of display panels and are difficult to improve the display brightness under large viewing angles, making it difficult to improve the light output performance of display panels.

Therefore, there is an urgent need for a display panel to address the aforementioned technical issues.

SUMMARY

One embodiment of the present disclosure is directed to a display panel that can alleviate the technical problem of limited improvement in light output efficiency of display panels due to the current micro lens structure and difficulty in improving display brightness under large viewing angles.

To solve the technical problem, the technical solution of the present disclosure is to provide a display panel.

The display panel includes:

a substrate;

a light-emitting layer, located on one side of the substrate, comprising a plurality of pixel units;

an insulation layer, located on one side of the light-emitting layer away from the substrate, comprising a plurality of convex portions corresponding to a pixel unit and a plurality of grooves disposed between adjacent convex portions; and a flat layer, located on one side of the insulation layer away from the substrate, wherein a refractive index of the flat layer is lower than a refractive index of the insulation layer.

The insulation layer comprises a first insulator layer and a second insulator layer, and each of the convex portions comprises a first convex portion corresponding to the first insulator layer and a second convex portion corresponding to the second insulator layer, a roughness of a side wall of the groove corresponding to the first convex portion is greater than a roughness of a side wall of the groove corresponding to the second convex portion.

Preferably, the first insulator layer is disposed between the substrate and the second insulator layer.

Preferably, both the first insulator layer and the second insulator layer comprise inorganic insulation materials.

Preferably, both the first insulator layer and the second insulator layer contain the same inorganic insulation material, and a film-forming mass of the first insulator layers and a film-forming mass of the second insulator layers is different.

Preferably, a nitrogen content in the first insulator layer is lower than a nitrogen content in the second insulator layer.

Preferably, the display panel further includes:

a packaging layer, located on the side of the light-emitting layer away from the substrate; and a touch layer, located on one side of the packaging layer away from the substrate, comprising the first insulator layer, a first metal layer, the second insulator layer, a second metal layer, and the flat layer stacked sequentially;

The groove exposes a portion of a surface of the packaging layer on one side away from the substrate, and a roughness of the surface of the packaging layer on the side away from the substrate corresponding to the groove is disposed between the roughness of the side wall of the groove corresponding to the second convex portion and the roughness of the side wall of the groove corresponding to the first convex portion.

Preferably, the packaging layer comprises a first inorganic insulation layer, a first organic insulation layer, and a second inorganic insulation layer sequentially stacked, the groove exposes a portion of the surface of the second inorganic insulation layer on one side away from the substrate, a roughness of the surface of the second inorganic insulation layer on the side away from the substrate corresponding to the groove is disposed between the roughness of the side wall of the groove corresponding to the second convex portion and the roughness of the side wall of the groove corresponding to the first convex portion.

Preferably, the roughness of the surface of the second inorganic insulation layer on one side away from the substrate corresponding to the groove is greater than the roughness of the side wall of the groove corresponding to the second convex portion, and less than the roughness of the side wall of the groove corresponding to the first convex portion.

Preferably, the second inorganic insulation layer comprises inorganic insulation materials different from the first insulator layer and the second insulator layer.

Preferably, the surface of one side of the packaging layer near the insulation layer comprises a first portion and a second portion, the groove exposes the second portion, the convex portion covers the first portion, and a roughness of the second portion is greater than a roughness of the first portion.

Preferably, the second metal layer comprises a plurality of touch electrodes disposed between the corresponding pixel units, and the first metal layer comprises a touch wiring disposed between corresponding pixel units; and The insulation layer further comprises an insulation portion disposed between the pixel units, a groove disposed between the insulation portion and the convex portion, the insulation portion comprises a first insulation sub portion disposed corresponding to the first insulator layer and a second insulation sub portion corresponding to the second insulator layer, and a touch control wiring disposed between the first insulation sub portion and the second insulation sub portion, the touch electrode is disposed between the second insulation portion and the flat layer.

Preferably, the convex portion comprises a first surface near the substrate and a second surface far from the substrate; and The first surface and the second surface intersect with the same perpendicular cross-section of the substrate to form a first intersection line and a second intersection line, and a length of the first intersection line is greater than a length of the second intersection line.

Preferably, a roughness of the second surface of a raised portion is less than a roughness of the side wall corresponding to the groove of a second raised portion.

Preferably, the raised portion corresponds to the side wall of the groove comprising a side wall curve, The side wall curve is formed by the intersection of the side wall of the raised portion corresponding to the groove and the cross-section perpendicular to the substrate, and the side wall curve is disposed between the first intersection line and the second intersection line.

An intersection angle disposed between the side wall curve and the first intersection line is greater than or equal to 20 degrees, and an intersection angle disposed between the side wall curve and the first intersection line is less than or equal to 55 degrees.

Preferably, a thickness of the first convex portion is less than or equal to a thickness of the second convex portion.

Preferably, along a direction from the substrate to the insulation layer, the roughness of the side wall corresponding to the groove of the first convex portion gradually decreases, and the roughness of the side wall corresponding to the groove of the second convex portion gradually decreases.

Preferably, the thickness of the convex portion is greater than or equal to 0.5 micrometers.

Preferably, the display panel further comprises a pixel definition layer, The pixel definition layer is located on the same side as the pixel unit on the substrate, the pixel definition layer comprising a pixel definition portion and a second opening located between the pixel definition portions, the pixel unit located within the second opening, and the convex portion corresponding to the second opening.

Preferably, the difference in refractive index disposed between the insulating layer and the flat layer is greater than or equal to 0.3, and the difference in refractive index disposed between the insulating layer and the flat layer is less than or equal to 0.5.

Preferably, the flat layer is selected from a transparent organic material.

Advantageous Effect

One embodiment of the present disclosure utilizes a high refractive index insulation layer to form a convex portion, and a low refractive index flat layer is disposed on the convex portion, so that a side wall in contact with the flat layer of the convex portion forms a positive angle convergence effect on the light emitted by the pixel unit, thereby improving the light output efficiency of the positive angle. At the same time, a rough surface is formed by utilizing the side walls of a first convex portion and a second convex portion of the convex portion, and the light emitted by the pixel units is arranged and scattered at a large angle, so that the light at a large angle of view does not attenuate too severely, achieving a balance disposed between improving the efficiency of positive angle light output and maintaining the efficiency of large angle light output without excessive attenuation. A roughness of the side wall of the groove corresponding to the first raised portion is relatively large, which increases the exit angle of some light emitted by the pixel unit and improves the display brightness of the display panel under a large viewing angle. By utilizing the roughness of the side wall of the groove corresponding to the second raised portion, the exit angle of some light is converged, which improves the output efficiency and performance of the display panel.

DESCRIPTION OF THE EMBODIMENTS

Figure 1:
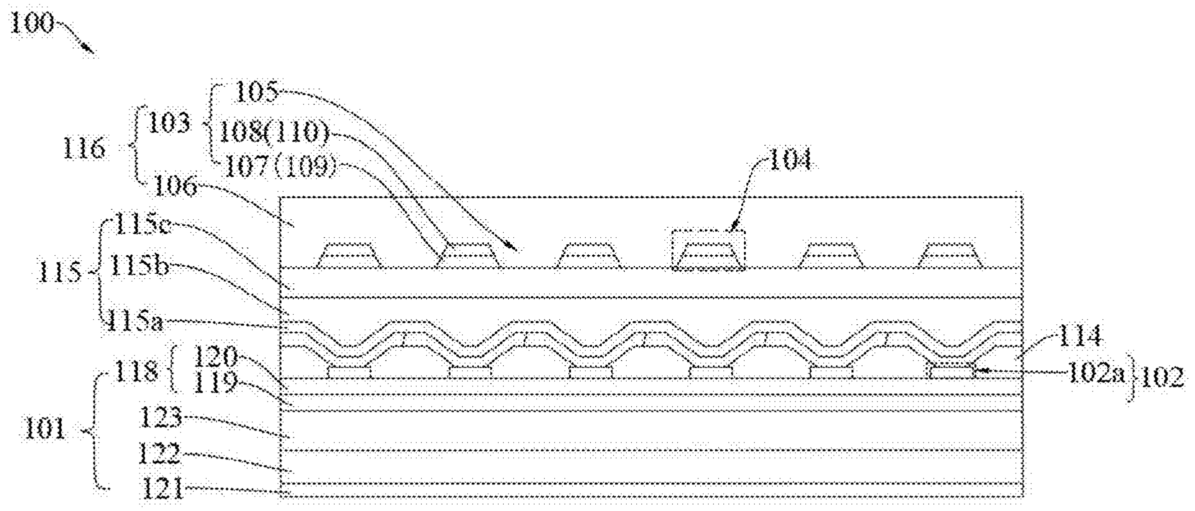
FIG. 1 is a schematic diagram of a structure of a display panel according to one embodiment of the present disclosure.

The present disclosure provides a display panel. In order to make the purpose, technical solutions and effects of the present disclosure clearer and clearer, the present disclosure will be further described in detail below with reference to the accompanying drawings and examples. It should be understood that the specific embodiments described here are only used to explain the present disclosure and are not used to limit the present disclosure.

At present, the micro lens structure used in display panels has limited improvement in the luminous efficiency of display panels and is difficult to improve the display brightness of display panels under large viewing angles. There are technical problems that make it difficult to improve the luminous performance of display panels.

Please refer to FIGS. 1 to 4. One embodiment of the present disclosure is directed to a display panel 100.

The display panel 100 comprises a substrate 101, a light-emitting layer 102, an insulation layer 103 and a flat layer 106.

The light-emitting layer 102 is located on one side of the substrate 101 and comprises a plurality of pixel units 102*a*.

The insulation layer 103 is located on one side of the light-emitting layer 102 away from the substrate 101. The insulation layer 103 comprises a plurality of convex portions 104 corresponding to a pixel unit 102*a* and a plurality of grooves 105 disposed between adjacent convex portions 104.

The flat layer 106 is located on one side of the insulation layer 103 away from the substrate 101, and a refractive index of the flat layer 106 is lower than a refractive index of the insulation layer 103.

The insulation layer 103 comprises a first insulator layer 107 and a second insulator layer 108 arranged in layers. Each of the convex portions 104 comprises a first convex portion 109 corresponding to the first insulator layer 107 and a second convex portion 110 corresponding to the second insulator layer 108. A roughness of the side wall of the groove 105 corresponding to the first convex portion 109 is greater than a roughness of the side wall of the groove 105 corresponding to the second convex portion 110.

The embodiment of the present disclosure utilizes a high refractive index insulation layer to form a convex portion 104, and a low refractive index flat layer 106 is disposed on the convex portion 104, so that the side walls of the convex portion 104 in contact with the flat layer 106 form a positive angle convergence effect on the light emitted by the pixel unit 102*a*, thereby improving a light output efficiency of the positive angle. At the same time, a rough surface is formed by utilizing the side walls of the first convex portion 109 and the second convex portion 110 of the convex portion 104, and the light emitted by the pixel unit 102*a* is arranged and scattered at a large angle, so that the light under a large angle of view does not attenuate too severely, achieving a balance disposed between the improvement of the front view angle light output efficiency and the large angle light output efficiency without excessive attenuation. The roughness of the side wall of the groove 105 corresponding to the first convex portion 109 is relatively large, which increases an exit angle of some of the light emitted by the pixel unit 102*a* and improves the display brightness of the display panel 100 under a large viewing angle. By utilizing the roughness of the side wall of the groove 105 corresponding to the second convex portion 110, the exit angle of some of the light is converged, which improves the output efficiency of the display panel 100 and improves its output performance.

Now describe the technical solution of this embodiment of the present disclosure in conjunction with specific implementation examples.

Please refer to FIGS. 1 to 4, where the pixel unit 102*a* corresponds to the convex portion 104. In the light emitted by pixel unit 102*a* and reaches the side wall of the groove 105 corresponding to the convex portion 104, an incident angle of the light near the substrate 101 in the side wall of the groove 105 corresponding to the convex portion 104 is smaller (the angle disposed between the incoming light and the normal), making it more difficult to change its exit angle to be perpendicular to the plane where the substrate 101 is located. The incident angle of the light that reaches the side wall of the groove 105 corresponding to the convex portion 104 and is far away from the substrate 101 is larger, making it easier to change its exit angle to be perpendicular to the plane where the substrate 101 is located. Therefore, a roughness of the end near the substrate 101 in the side wall of the groove 105 corresponding to the convex portion 104 is greater than a roughness of the end far away from the substrate 101 in the side wall of the groove 105 corresponding to the convex portion 104. By using a larger roughness at one end near the substrate 101 in the side wall of the groove 105 corresponding to the convex portion 104, the angle of light that is difficult to change to be perpendicular to the plane of the substrate 101 is further deviated from the direction perpendicular to the plane of the substrate 101, thereby improving the display brightness of the display panel 100 at a large angle. Use a smaller roughness on the side wall of the groove 105 corresponding to the convex portion 104, away from the substrate 101, to further converge the light emission angle that is easy to change to be perpendicular to the plane where the substrate 101 is located, improve the forward light output rate of the display panel 100, and thus improve the light output performance of the display panel 100. The exit angle perpendicular to the plane where the substrate 101 is located" in this application indicates that the angle disposed between the exit direction of the light and the plane where the substrate 101 is located is disposed between 85 degrees and 95 degrees. The display brightness of display panel 100 at a large angle, that is, the display brightness of display panel 100 obtained when deviating from the front view angle of display panel 100 (for example, the display brightness of display panel 100 at a 45 degree angle disposed between the direction perpendicular to the plane of substrate 101).

Specifically, the insulation layer 103 may comprise a first insulator layer 107 and a second insulator layer 108 arranged in layers. The first insulator layer 107 is arranged between the substrate 101 and the second insulator layer 108, and the convex portion 104 comprises: a first convex portion 109 corresponding to the first insulator layer 107 and a second convex portion 110 corresponding to the second insulator layer 108, the roughness of the side wall of the first convex portion 109 corresponding to groove 105 is greater than the roughness of the side wall of the second convex portion 110 corresponding to groove 105, so that the roughness of the end near the substrate 101 in the side wall of the convex portion 104 corresponding to groove 105 is greater than the roughness of the end far away from the substrate 101 in the side wall of the convex portion 104 corresponding to groove 105.

The roughness of the side wall of the groove 105 corresponding to the convex portion 104 gradually decreases along the direction from the substrate 101 to the insulation layer 103. Along the direction from substrate 101 to insulation layer 103, the incident angle of the light emitted by pixel unit 102*a* and reaching the first side 111 gradually increases, and the exit angle of the light gradually changes to be perpendicular to the plane where substrate 101 is located. Therefore, by reducing the roughness of the side wall corresponding to the groove 105 along the direction from the substrate 101 to the insulation layer 103, it is beneficial to control the proportion of light emitted from the pixel unit 102*a* from the direction perpendicular to the plane where the substrate 101 is located, as well as the proportion emitted from the large angle direction, so as to obtain a suitable light output rate of the display panel 100 and the display brightness of the display panel 100 at a large viewing angle. Specifically, along the direction from the substrate 101 to the insulation layer 103, the roughness of the side wall of the groove 105 corresponding to the first convex portion 109 gradually decreases, while the roughness of the side wall of the groove 105 corresponding to the second convex portion 110 gradually decreases.

Please refer to FIG. 2 to FIG. 5. Specifically, the first convex portion 109 comprises a first side wall 111*a* corresponding to the groove 105, and the second convex portion 110 comprises a second side wall 111*b* corresponding to the groove 105. The roughness of the first side wall 111*a* is greater than the roughness of second side wall 111*b*. The first side wall 111*a* is continuous with the second side wall 111*b*. The light emitted by pixel unit 102*a* that reaches the second side wall 111*b* converges as much as possible through the second side wall 111*b* with a smaller roughness, and more light rays exit perpendicular to the plane where the substrate 101 is located. The light emitted by pixel unit 102*a* that reaches the first side wall 111*a* is amplified by passing through the first side wall 111*a* with a relatively high roughness, causing the exit angle to deviate further from the direction perpendicular to the plane where the substrate 101 is located, thereby improving the display brightness of the display panel 100 at a large angle. Please refer to FIG. 2. In the light emitted by pixel unit 102*a*, when light L4, L5, and L6 are incident on the second side wall 111*b* with lower roughness, due to the roughness of the second side wall 111*b*, the normal directions of the incident light L4, L5, and L6 are different. Light L4, L5, and L6 deflect towards the direction perpendicular to the plane of the substrate 101 under the condition of satisfying the refractive law, thereby improving the output efficiency of the display panel 100. In the light emitted by pixel unit 102*a*, when light L7, L8, and L9 are incident on the first side wall 111*a* with higher roughness, due to the greater roughness of the first side wall 111*a*, light L7, L8, and L9 deflect towards the large viewing angle direction of display panel 100 under the condition of satisfying the refraction law, thereby improving the brightness of the large viewing angle of display panel 100.

The first insulator layer 107 and the second insulator layer 108 both comprise inorganic insulation materials. The first insulator layer 107 and the second insulator layer 108 are both inorganic insulation layers, which can be formed using the same etching method (such as wet etching).

Specifically, the inorganic insulation materials comprised in the first insulator layer 107 and the second insulator layer 108 are different, and different insulation materials have different tolerance levels to the etching process. Therefore, the degree of etching is different, resulting in the inorganic insulation materials comprised in the first insulator layer 107 being more sensitive to the etching process and having a rougher surface. The roughness of the side wall of the groove 105 corresponding to the first convex portion 109 is greater than the roughness of the side wall of the groove 105 corresponding to the second convex portion 110, the roughness of the first side wall 111*a* is greater than the roughness of the second side wall 111*b*.

In some embodiments, the first insulator layer 107 and the second insulator layer 108 both contain the same inorganic insulation material, and the film formation quality of the first insulator layer 107 and the second insulator layer 108 is different. The first insulator layer 107 and the second insulator layer 108 both contain the same inorganic insulation material, that is, the first insulator layer 107 and the second insulator layer 108 are composed of the same types of elements, for example, the first insulator layer 107 and the second insulator layer 108 respectively comprise elements such as Si, N, O, etc. The film formation quality of the first insulator layer 107 and the second insulator layer 108 is different, that is, there is a difference in the content of different elements disposed between the first insulator layer 107 and the second insulator layer 108. The difference in film formation quality disposed between the first insulator layer 107 and the second insulator layer 108 results in different tolerance levels of the first insulator layer 107 and the second insulator layer 108 to the etching process, resulting in a roughness of the side wall of the groove 105 corresponding to the first convex portion 109 being greater than a roughness of the side wall of the groove 105 corresponding to the second convex portion 110. For example, by controlling the nitrogen content (mass fraction) in the first insulator layer 107 and the second insulator layer 108, making the nitrogen content in the first insulator layer 107 lower than that in the second insulator layer 108 (mass fraction), it is beneficial to make the roughness of the first side wall 111*a* greater than the roughness of the second side wall 111*b*.

Figure 2:
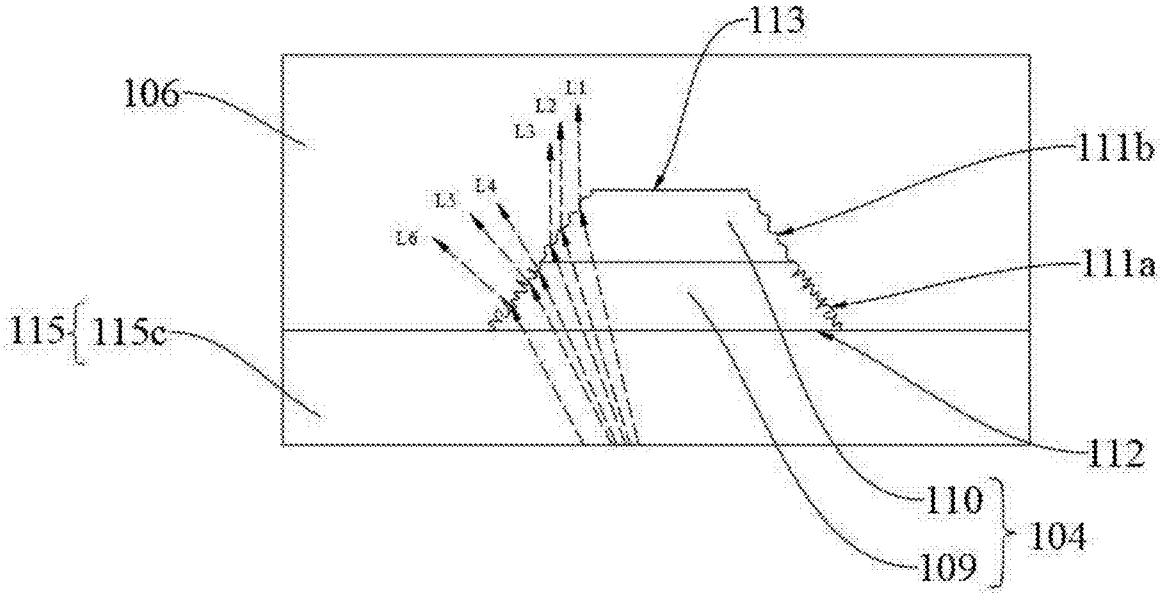
FIG. 2 is a schematic diagram of a first structure of a plurality of lens of the display panel according to one embodiment of the present disclosure.
Figure 3:
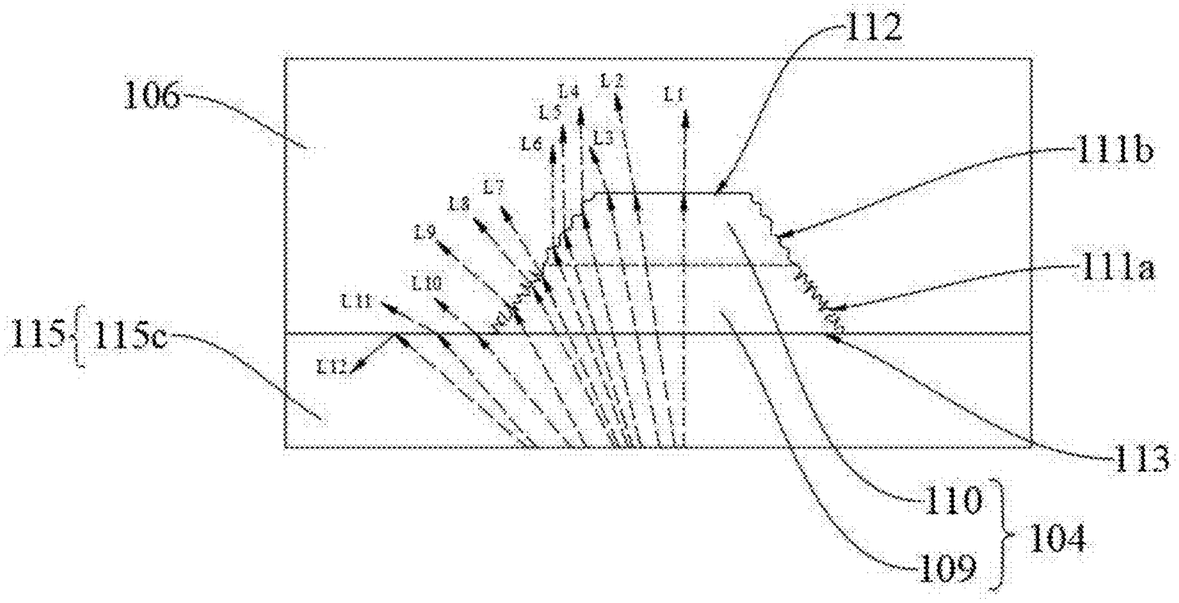
FIG. 3 is a schematic diagram of a second structure of the lens of the display panel according to one embodiment of the present disclosure.
Figure 4:
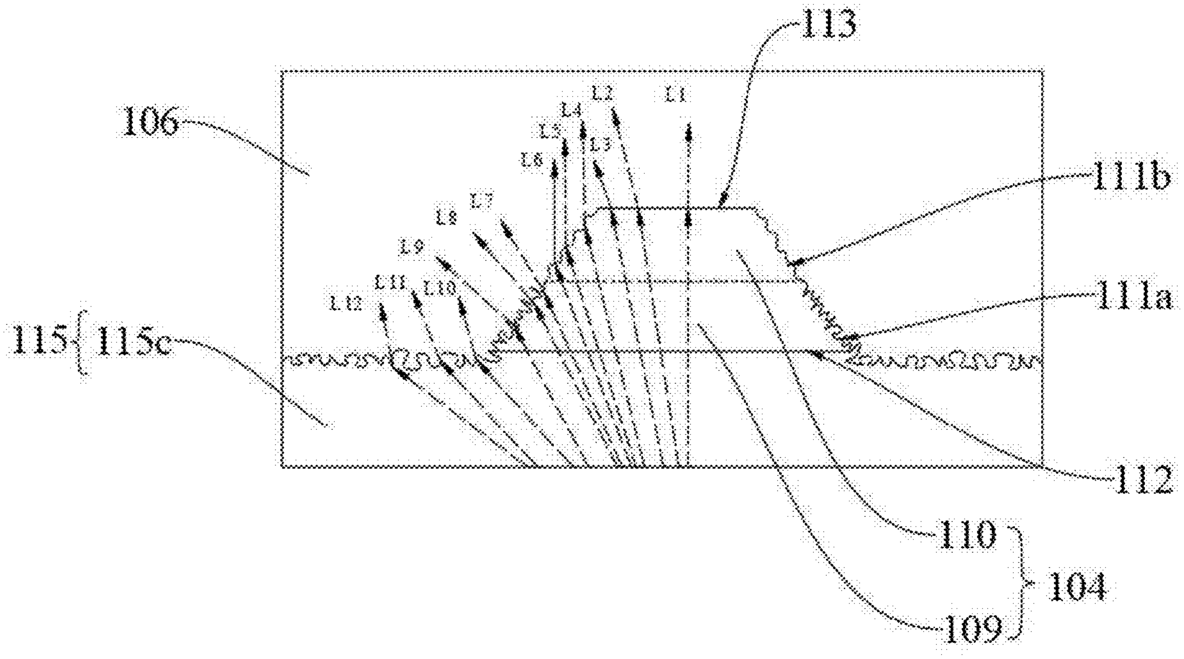
FIG. 4 is a schematic diagram of a third structure of the lens of the display panel according to one embodiment of the present disclosure.

Please refer to FIGS. 2 to 4, specifically, the convex portions comprise a first surface 112 near the substrate 101 and a second surface 113 away from the substrate 101.

In some embodiments, please refer to FIGS. 2 and 3, the second surface 113 can be a smooth plane. Alternatively, please refer to FIG. 4, the second surface 113 can be a plane with a certain roughness.

Figure 5:
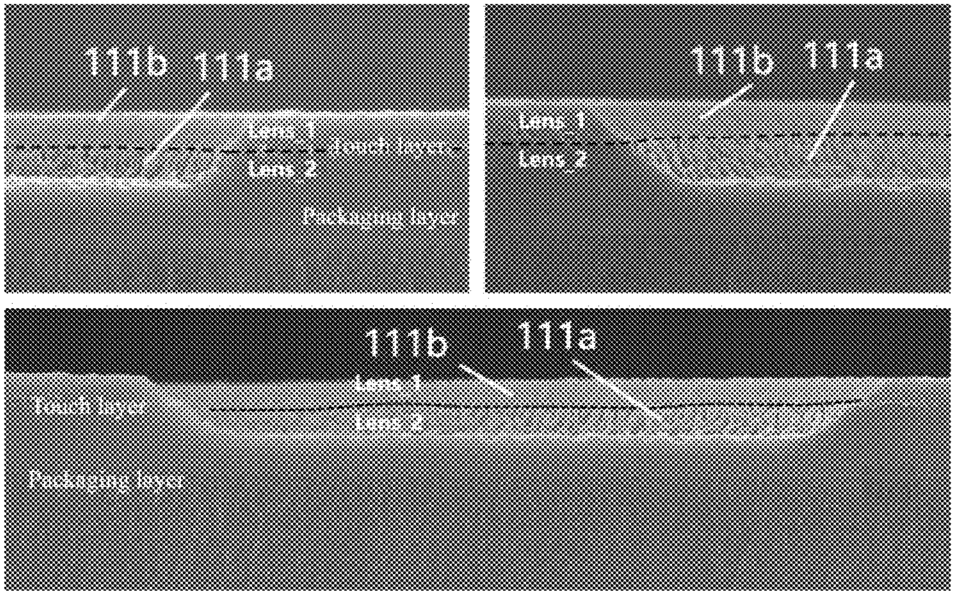
FIG. 5 is a cross-sectional morphology result of the lens of the display panel according to one embodiment of the present disclosure.

In some embodiments, the roughness of the side walls of the groove 105 corresponding to the convex portion 104, as well as the first surface 112 and second surface 113, can be determined by the slice morphology results shown in FIG. 5. In FIG. 5, Lens-1 represents the second convex portion 110, and Lens-2 represents the first convex portion 109. From FIG. 5, it can be seen that the roughness of the side wall of the groove 105 corresponding to the first convex portion 109 is significantly greater than the roughness of the side wall of the groove 105 corresponding to the second convex portion 110.

In some embodiments, please refer to FIG. 4, the roughness of the second surface 113 is smaller than the roughness of the second side wall 111*b*.

Please refer to FIGS. 2 and 3. In some embodiments, when the second surface 113 is a smooth plane, the light emitted by pixel unit 102*a*, L1, L2, and L3, when incident on the second surface 113, directly exits perpendicular to the plane where the substrate 101 is located. When the second surface 113 has roughness, in the light emitted by pixel unit 102*a*, when light L1, L2, L3 is incident on the second surface 113, some of the light (such as light L1, L3) deviates from the exit angle, and some of the light remains perpendicular to the plane where the substrate 101 is located, which is conducive to maintaining the balance disposed between the frontal light output efficiency of the display panel 100 and the brightness of different viewing angles. Preferably, in order to further balance the light rays emitted from the second surface 113 that deviate from the plane perpendicular to the substrate 101 and the light rays that deviate from the plane perpendicular to the substrate 101, the roughness of the second surface 113 is smaller than the roughness of the second side wall 111*b*.

An orthographic projection of pixel unit 102*a* on the plane where the second surface 113 is located is located within the second surface 113. The orthographic projection of the third side on the plane where the second surface 113 is located covers the second surface 113, so that the light emitted by pixel unit 102*a* can change the direction of emission as much as possible through the side wall of the groove 105 corresponding to the convex portion 104, so that more light can be emitted in a direction perpendicular to the plane where the substrate 101 is located, Increase the light output of display panel 100. Specifically, the first surface 112 and the second surface 113 intersect with the same perpendicular cross-section of the substrate to form the first and second intersection lines, and a length of a first intersection line is greater than a length of a second intersection line.

In some embodiments, the side wall of the groove 105 corresponding to the convex portion 104 comprises a side wall curve, which is formed by the intersection of the side wall of the groove 105 corresponding to the convex portion 104 with the cross-section perpendicular to the substrate. The side wall curve is disposed between the first intersection line and the second intersection line. In order to change the direction of light emission as much as possible through the side wall of the groove 105 corresponding to the convex portion 104, thereby improving the light output of the display panel 100, the intersection angle disposed between the side wall curve and the first intersection line is greater than or equal to 20 degrees, and the intersection angle disposed between the side wall curve and the first intersection line is less than or equal to 55 degrees, for example, it can be 25 degrees, 27 degrees, 30 degrees, 35 degrees, 40 degrees, 45 degrees, 50 degrees, etc. Among them, the intersection angle disposed between the side wall curve and the first surface 112 can be approximated as a straight edge of the side wall curve (fitting the uneven side wall curve as a straight line), and the angle disposed between the straight line formed by the fitting of the side wall curve and the first intersection line can be obtained.

Please refer to FIG. 1. In some embodiments, the display panel 100 also comprises a pixel definition layer 114, which is located on the same side as the pixel unit 102*a* on the substrate 101. The pixel definition layer 114 comprises a pixel definition portion and a second opening located between the pixel definition portions, and the pixel unit 102*a* is located within the second opening. The convex portion 104 is correspondingly arranged with the second opening.

The display panel 100 comprises an anode, a light-emitting layer 102, and a cathode layer, wherein the anode is located within the second opening, and the pixel definition portion surrounds the anode and covers the edge of the anode. The functional layer is located on the side of the pixel definition layer 114 away from the substrate 101, and the cathode layer covers the functional layer. The light-emitting layer 102 comprises a hole organic layer, a luminescent material layer, and an electronic organic layer sequentially stacked along the direction from the anode to the cathode layer. The hole organic layer may comprise a hole injection layer and a hole transport layer, wherein the hole injection layer is in direct contact with the anode, and the hole transport layer is located between the hole injection layer and the luminescent material layer. The hole organic layer may further comprise an electron barrier layer located between the hole transport layer and the luminescent material layer. The electronic organic layer may comprise an electron injection layer and an electron transport layer, wherein the electron injection layer is in direct contact with the cathode layer, and the electron transport layer is located between the electron injection layer and the luminescent material layer. The electronic organic layer may also comprise a hole blocking layer located between the electron transport layer and the light-emitting layer 102.

In some embodiments, when the display panel 100 is displayed, the pixel units 102*a* participating in the display emit light, and at least some of the light emitted by the pixel units 102*a* changes their exit angle through the convex portion 104, thereby emitting in a direction perpendicular to the plane where the substrate 101 is located, thereby improving the output rate of the display panel 100.

Please refer to FIG. 1. In some embodiments, the display panel 100 further comprises a packaging layer 115 located on the side of the light-emitting layer 102 away from the substrate. Specifically, the packaging layer 115 is located between the insulation layer 103 and the pixel unit 102*a*. The packaging layer 115 is in direct contact with the insulation layer 103 on one side near the insulation layer 103. The encapsulation layer 115 can be formed by alternating layers of one or more organic layers and one or more inorganic layers. Each inorganic layer or organic layer can provide a plurality of. The organic layer is formed by a polymer and can be a laminated layer or a single layer, for example, formed by any one of polyethylene terephthalate, polyimide, polycarbonate, epoxy resin, polyethylene, or polyacrylate. The organic layer can be formed from polyacrylates, specifically comprising substances obtained by polymerization comprising monomers based on diacrylate and monomers based on triacrylate. The monomer composition may also comprise monomers based on polyacrylates. In addition, the monomer composition may also comprise well-known photo initiators such as TPO, but the monomer composition is not limited to this. The inorganic layer can be a laminated layer or a single layer comprising metal oxides or metal nitrides. For example, the inorganic layer may comprise any of $SiN_x$, $Al_2O_3$, $SiO_2$, or $TiO_2$. The packaging layer 115 may sequentially comprise a first inorganic insulation layer 115*a*, a first organic insulation layer 115*b*, and a second inorganic insulation layer 115*c* located on the cathode layer in a direction away from the substrate 101 (as shown in FIG. 1). In addition, the packaging layer may sequentially comprise a first inorganic insulation layer, a first organic insulation layer, a second inorganic insulation layer, a second organic packaging layer, and a third inorganic packaging layer located on the cathode layer in a direction away from the substrate 101. In addition, the packaging layer may sequentially comprise a first inorganic insulation layer, a first organic insulation layer, a second inorganic insulation layer, a second organic packaging layer, a third inorganic packaging layer, a third organic packaging layer, and a fourth inorganic packaging layer located on the cathode layer in a direction away from the substrate 101.

In some embodiments, the groove 105 exposes a portion of the surface of the packaging layer on the side away from the substrate, i.e., the groove 105 forms a first opening of the exposed portion of the packaging layer, and the first opening exposes a portion of the surface of the packaging layer on the side away from the substrate.

Please refer to FIG. 2. The surface of the packaging layer 115 on the side away from the substrate can be a smooth plane, that is, the surface roughness of the exposed portion of the packaging layer 115 on the side away from the substrate is the same as the surface roughness of the unexposed portion of the packaging layer 115 on the side away from the substrate.

Alternatively, please refer to FIGS. 3 and 4. The surface of the packaging layer 115 near the insulation layer 103 comprises a first portion and a second portion, wherein the first portion is in direct contact with the first convex portion 109 and the second portion is in direct contact with the flat layer 106. That is, groove 105 exposes the second portion. The first portion is a smooth plane, and the second portion has a certain roughness, that is, the roughness of the second portion is greater than the roughness of the first portion.

In some embodiments, due to the formation of the first opening and convex portion 104 through etching of the insulation layer 103, the inorganic insulation layer in direct contact with the convex portion 104 in the packaging layer 115 is formed. When the first opening is formed, the second portion with roughness is formed by further etching the exposed packaging layer 115 of the first opening. The first portion is not etched under the protection of the convex portion 104, and the roughness of the second portion is greater than the roughness of the first portion.

Please refer to FIGS. 2 to 4. The light emitted from pixel unit 102*a* will reach the second portion and exit, such as lines L10, L11, and L12. When the second portion is a smooth plane (as shown in FIG. 2), some of the light in that portion (such as line L12) will undergo total reflection due to excessive incidence angle. When the roughness of the second portion is greater than the roughness of the first portion (as shown in FIGS. 3 and 4), The light that originally could not be emitted due to total reflection can be emitted due to a change in the normal direction, further increasing the display brightness of the display panel 100 in a large viewing angle.

In some embodiments, the groove 105 exposes a portion of the surface of the packaging layer 115 on the side away from the substrate, and the roughness of the surface of the packaging layer on the side away from the substrate corresponding to the groove 105 is disposed between the roughness of the side wall of the groove 105 corresponding to the second convex portion 110 and the roughness of the side wall smaller than the roughness of the groove 105 corresponding to the first convex portion 109. Specifically, the roughness at the groove 105 on the surface of the packaging layer 115 away from the substrate 101 is greater than the roughness on the side wall of the groove 105 corresponding to the second convex portion 110, and less than the roughness on the side wall of the groove 105 corresponding to the first convex portion 109. Specifically, the packaging layer 115 comprises a first inorganic insulation layer 115*a*, a first organic insulation layer 115*b*, and a second inorganic insulation layer 115*c* arranged in sequence. The groove 105 exposes a portion of the surface of the second inorganic insulation layer 115*c* on one side away from the substrate, The roughness of the surface of the second inorganic insulation layer 115*c* away from the substrate at the corresponding groove 105 is disposed between the roughness of the side wall of the groove 105 corresponding to the second convex portion 110 and the roughness of the side wall of the groove 105 corresponding to the first convex portion 109. Furthermore, the roughness of the surface of the second inorganic insulation layer 115*c* away from the substrate at the corresponding groove 105 is greater than the roughness of the side wall of the groove 105 corresponding to the second convex portion 110, and is less than the roughness of the side wall of the groove 105 corresponding to the first convex portion 109, that is, the roughness of the second portion is greater than the roughness of the second side wall 111*b*, and the roughness of the second portion is less than the roughness of the first side wall 111*a*. Please refer to FIGS. 3 and 4. The light emitted from pixel unit 102*a* and reaching the second portion has a larger incidence angle. Utilizing the roughness of the second portion disposed between the roughness of the first side wall 111*a* and the roughness of the second side wall 111*b* is beneficial for controlling as much light reaching the second portion as possible to exit from the large angle direction of the display panel 100.

In some embodiments, the second inorganic insulation layer 115*c* comprises inorganic insulation materials different from the first insulator layer 107 and the second insulator layer 108, in order to make the second portion have a roughness disposed between the roughness of the first sub side wall 111*a* and the roughness of the second sub side wall 111*b*.

In some embodiments, in order to increase the light output of the display panel 100 by allowing more light emitted by the pixel unit 102*a* to pass through the side wall of the groove 105 corresponding to the second convex portion 110, a thickness of the first convex portion 109 is less than or equal to a thickness of the second convex portion 110, and correspondingly, the thickness of the first insulator layer 107 is less than or equal to the thickness of the second insulator layer 108.

In some embodiments, the thickness of the convex portion 104 is greater than or equal to 0.5 micrometers, for example, it can be 0.6 micrometers, 0.8 micrometers, 1 micrometer, 1.5 micrometers, 2 micrometers, etc., in order to effectively improve the light output of the display panel 100.

Please refer to FIG. 1. In some embodiments, the display panel 100 also comprises a touch layer 116, which is located on the side of the pixel unit 102*a* away from the substrate 101. The touch layer 116 comprises: a first insulator layer 107, a first metal layer, a second insulator layer 108, a second metal layer, and a flat layer 106 arranged in sequence.

In some embodiments, the second metal layer comprises touch electrodes disposed between corresponding pixel units 102*a*, the first metal layer comprises touch wiring disposed between corresponding pixel units 102*a*, the insulation layer 103 further comprises an insulation portion disposed between pixel units 102*a*, and a groove 105 disposed between the insulation edge portion and the convex portion 104, The insulation portion comprises: a first insulation sub portion corresponding to the first insulator layer 107 and a second insulation sub portion corresponding to the second insulator layer 108, the touch wire is disposed between the first insulation sub portion and the second insulation sub portion, and the touch electrode is disposed between the second insulation sub portion and the flat layer 106.

Please refer to FIG. 1. In some embodiments, the flat layer 106 covers the insulation layer 103, and the refractive index of the flat layer 106 is lower than the roughness of the insulation layer 103. The difference in refractive index disposed between the insulation layer 103 and the flat layer 106 is greater than or equal to 0.3, and the difference in refractive index disposed between the insulation layer 103 and the flat layer 106 is less than or equal to 0.5. For example, it can be 0.35, 0.4, 0.45, etc. The flat layer 106 can be selected from transparent organic materials.

In some embodiments, there is a certain difference in refractive index disposed between the first insulator layer 107 and the second insulator layer 108. At this time, the difference in refractive index disposed between the first insulator layer 107 and the flat layer 106 is greater than or equal to 0.3, and the difference in refractive index disposed between the first insulator layer 107 and the flat layer 106 is less than or equal to 0.5. The difference in refractive index disposed between the second insulator layer 108 and the flat layer 106 is greater than or equal to 0.3, and the difference in refractive index disposed between the second insulator layer 108 and the flat layer 106 is less than or equal to 0.5.

Please refer to FIG. 1, In some embodiments, the substrate 101 comprises a substrate 121, a buffer layer 122 located on one side of the substrate 121, a thin film transistor layer 123 located on the side of the buffer layer 122 away from the substrate 121, and a second flat layer 118 located on the side of the thin film transistor layer 123 away from the substrate 121.

The substrate 121 can be a hard substrate, such as a glass substrate. Alternatively, the substrate 121 can be a flexible substrate, such as a substrate formed by polyimide. When the substrate 121 is a flexible substrate, the substrate 121 comprises a first flexible sub substrate, an intermediate layer, an adhesive layer, and a second flexible sub substrate. The first flexible sub substrate and the second flexible sub substrate can be formed from the same material such as polyimide, the intermediate layer can be formed from at least one inorganic material comprising $SiO_x$ and $SiN_x$, and the adhesive layer can be formed from hydrogenated amorphous silicon (a-Si: H).

The buffer layer 122 may comprise one or more inorganic insulation layers, which comprise materials such as silicon oxide or silicon nitride. The buffer layer 122 can provide a flattening layer on the upper surface of the substrate 121 and can prevent or prevent impurities and moisture from infiltrating into the light-emitting layer from the substrate 121. Specifically, the buffer layer 122 comprises a first sub buffer layer 122 formed by silicon nitride and a second sub buffer layer 122 formed by silicon oxide. The second and first sub buffer layers 122 can be formed from silicon nitride with the same film mass (such as the same density and film stress), and an oxide film can be positioned at the interface disposed between the second and first sub buffer layers 122. In practical applications, the thickness of the first sub buffer layer 122 can range from 50 nm to 100 nm, and the thickness of the second sub buffer layer 122 can be approximately 100 nm to 300 nm.

The thin film transistor layer 123 comprises a thin film transistor, wherein the thin film transistor comprises a semiconductor formed on the buffer layer 122, which can be formed from polycrystalline silicon. Among them, the semiconductor is divided into a channel region, a source region formed on both sides of the channel region, and a drain region. The channel region of the semiconductor is polycrystalline silicon without doping impurities, that is, an intrinsic semiconductor. The source and drain regions are polycrystalline silicon doped with conductive impurities, i.e. impurity semiconductors. Impurities doped in the source and drain regions can be either P-type or N-type impurities. The thin film transistor layer 123 further comprises a first gate insulation layer, which covers the semiconductor. The first gate insulation layer can be a plurality of layers or single layers comprising at least one of tetraethyl orthosilicate (TEOS), silicon nitride, and silicon oxide.

The thin film transistor further comprises a first gate formed on the insulation layer of the first gate, and the first gate overlaps with the channel region. The first gate can be formed into a plurality of layers or single layers comprising low resistance materials such as Al, Ti, Mo, Cu, Ni, or their alloys, or materials with high corrosion resistance. The thin film transistor layer 123 also comprises a second gate insulation layer, which covers the first gate. The second gate insulation layer can be a plurality of layers or single layers comprising at least one of tetraethyl orthosilicate (TEOS), silicon nitride, and silicon oxide. The thin film transistor further comprises a second gate formed on the insulation layer of the second gate, wherein the second gate overlaps with the first gate, and the second gate can be formed into a plurality of layers or single layers comprising low resistance materials such as Al, Ti, Mo, Cu, Ni, or their alloys, or materials with high corrosion resistance. The thin film transistor layer 123 further comprises a first interlayer insulation layer formed on the second gate, which can be formed into a plurality of layers or monolayers, such as those formed by tetraethyl orthosilicate (TEOS), silicon nitride, or silicon oxide. Among them, the first interlayer insulation layer and the first gate insulation layer, and the second gate insulation layer comprise a source contact hole and a drain contact hole. The source and drain regions are respectively exposed through the source and drain contact holes.

The thin film transistor further comprises a source and a drain arranged on the same layer, both formed on the first interlayer insulation layer. The source is connected to the source region through the source contact hole, and the drain is connected to the drain region through the drain contact hole. Among them, the source electrode and the drain electrode can be a plurality of layers or single layers formed by low resistance materials such as Al, Ti, Mo, Cu, Ni, or their alloys, or materials with high corrosion resistance. For example, the source and drain electrodes can be triple layers of Ti/Cu/Ti, Ti/Ag/Ti, Ti/Al/Ti or Mo/Al/Mo, or other single-layer or multi-layer structures.

Please refer to FIG. 1, where the second flat layer 118 is formed on the source and drain electrodes. The second flat layer 118 can be formed into a plurality of layers or monolayers, such as those formed by tetraethyl orthosilicate (TEOS), silicon nitride, or silicon oxide, and can be formed from organic materials with low dielectric constants (such as polyimide). The second flat layer 118 may comprise a first flat sub layer 119 and a second flat sub layer 120, wherein the first flat sub layer 119 is located on the side of the second flat sub layer 120 near the substrate 121.

The substrate 101 further comprises a metal transfer layer located between the first flat sublayer 119 and the second flat sublayer 120, and the anode is connected to the thin film transistor through the metal transfer layer.

In some embodiments, the display panel 100 also comprises a cover layer located on the side of the flat layer 106 away from the substrate 101, which can be a flexible cover layer.

In some embodiments, the display panel 100 also comprises a polarizing layer located between the cover layer and the flat layer 106.

The display panel 100 provided in the present embodiment has a larger roughness of the side wall of the groove corresponding to the first convex portion 109, which increases the exit angle of some light emitted by the pixel unit 102*a* and improves the display brightness of the display panel 100 under a large viewing angle. By utilizing the roughness of the side wall of the groove corresponding to the second convex portion 110, the exit angle of some light is converged, and the output efficiency of the display panel 100 is improved, Improved the light output performance of display panel 100.

The present embodiment discloses a display panel, which comprises a substrate, a light-emitting layer located on one side of the substrate, an insulating layer, and a flat layer. The insulating layer is provided with a raised portion corresponding to a pixel unit of the light-emitting layer and a groove disposed between adjacent raised portions. The raised portion comprises a first raised portion and a second raised portion, The roughness of the side wall of the groove corresponding to the first raised portion is greater than the roughness of the side wall of the groove corresponding to the second raised portion. The present disclosure utilizes the roughness of the side wall of the groove corresponding to the first raised portion to increase the exit angle of some light emitted by the pixel unit, thereby improving the display brightness of the display panel under a large viewing angle. By utilizing the roughness of the side wall of the groove corresponding to the second raised portion, the exit angle of some light is converged, improving the output efficiency and performance of the display panel.

For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A display panel, comprising:

a substrate;

a light-emitting layer, located on one side of the substrate, comprising a plurality of pixel units;

an insulation layer, located on one side of the light-emitting layer away from the substrate, comprising a plurality of convex portions corresponding to a pixel unit and a plurality of grooves disposed between adjacent convex portions; and a flat layer, located on one side of the insulation layer away from the substrate, wherein a refractive index of the flat layer is lower than a refractive index of the insulation layer;

wherein the insulation layer comprises a first insulator layer and a second insulator layer, and each of the convex portions comprises a first convex portion corresponding to the first insulator layer and a second convex portion corresponding to the second insulator layer, a roughness of a side wall of the groove corresponding to the first convex portion is greater than a roughness of a side wall of the groove corresponding to the second convex portion;

wherein a nitrogen content in the first insulator layer is lower than a nitrogen content in the second insulator layer.

2. The display panel as claimed in claim 1, wherein the first insulator layer is disposed between the substrate and the second insulator layer.

3. The display panel as claimed in claim 2, wherein both the first insulator layer and the second insulator layer comprise inorganic insulation materials.

4. The display panel as claimed in claim 3, wherein both the first insulator layer and the second insulator layer contain the same inorganic insulation material, and a film-forming mass of the first insulator layers and a film-forming mass of the second insulator layers is different.

5. The display panel as claimed in claim 2, further comprising:

a packaging layer, located on the side of the light-emitting layer away from the substrate; and a touch layer, located on one side of the packaging layer away from the substrate, comprising the first insulator layer, a first metal layer, the second insulator layer, a second metal layer, and the flat layer stacked sequentially;

wherein the groove exposes a portion of a surface of the packaging layer on one side away from the substrate, and a roughness of the surface of the packaging layer on the side away from the substrate corresponding to the groove is disposed between the roughness of the side wall of the groove corresponding to the second convex portion and the roughness of the side wall of the groove corresponding to the first convex portion.

6. The display panel as claimed in claim 5, wherein the packaging layer comprises a first inorganic insulation layer, a first organic insulation layer, and a second inorganic insulation layer sequentially stacked, the groove exposes a portion of the surface of the second inorganic insulation layer on one side away from the substrate, a roughness of the surface of the second inorganic insulation layer on the side away from the substrate corresponding to the groove is disposed between the roughness of the side wall of the groove corresponding to the second convex portion and the roughness of the side wall of the groove corresponding to the first convex portion.

7. The display panel as claimed in claim 6, wherein the roughness of the surface of the second inorganic insulation layer on one side away from the substrate corresponding to the groove is greater than the roughness of the side wall of the groove corresponding to the second convex portion, and less than the roughness of the side wall of the groove corresponding to the first convex portion.

8. The display panel as claimed in claim 6, wherein the second inorganic insulation layer comprises inorganic insulation materials different from the first insulator layer and the second insulator layer.

9. The display panel as claimed in claim 5, wherein the surface of one side of the packaging layer near the insulation layer comprises a first portion and a second portion, the groove exposes the second portion, the convex portion covers the first portion, and a roughness of the second portion is greater than a roughness of the first portion.

10. The display panel as claimed in claim 5, wherein the second metal layer comprises a plurality of touch electrodes disposed between the corresponding pixel units, and the first metal layer comprises a touch wiring disposed between corresponding pixel units; and wherein the insulation layer further comprises an insulation portion disposed between the pixel units, a groove disposed between the insulation portion and the convex portion, the insulation portion comprises a first insulation sub portion disposed corresponding to the first insulator layer and a second insulation sub portion corresponding to the second insulator layer, and a touch control wiring disposed between the first insulation sub portion and the second insulation sub portion, the touch electrode is disposed between the second insulation portion and the flat layer.

11. The display panel as claimed in claim 2, wherein the convex portion comprises a first surface near the substrate and a second surface far from the substrate; and wherein the first surface and the second surface intersect with the same perpendicular cross-section of the substrate to form a first intersection line and a second intersection line, and a length of the first intersection line is greater than a length of the second intersection line.

12. The display panel as claimed in claim 11, wherein a roughness of the second surface of a raised portion is less than a roughness of the side wall corresponding to the groove of a second raised portion.

13. The display panel as claimed in claim 11, wherein the raised portion corresponds to the side wall of the groove comprising a side wall curve, wherein the side wall curve is formed by the intersection of the side wall of the raised portion corresponding to the groove and the cross-section perpendicular to the substrate, and the side wall curve is disposed between the first intersection line and the second intersection line;

wherein an intersection angle disposed between the side wall curve and the first intersection line is greater than or equal to 20 degrees, and an intersection angle disposed between the side wall curve and the first intersection line is less than or equal to 55 degrees.

14. The display panel as claimed in claim 1, wherein a thickness of the first convex portion is less than or equal to a thickness of the second convex portion.

15. The display panel as claimed in claim 1, wherein along a direction from the substrate to the insulation layer, the roughness of the side wall corresponding to the groove of the first convex portion gradually decreases, and the roughness of the side wall corresponding to the groove of the second convex portion gradually decreases.

16. The display panel as claimed in claim 1, wherein the thickness of the convex portion is greater than or equal to 0.5 micrometers.

17. The display panel as claimed in claim 1, further comprising a pixel definition layer, wherein the pixel definition layer is located on the same side as the pixel unit on the substrate, the pixel definition layer comprising a pixel definition portion and a second opening located between the pixel definition portions, the pixel unit located within the second opening, and the convex portion corresponding to the second opening.

18. A display panel, comprising:

a substrate;

a light-emitting layer, located on one side of the substrate, comprising a plurality of pixel units;

an insulation layer, located on one side of the light-emitting layer away from the substrate, comprising a plurality of convex portions corresponding to a pixel unit and a plurality of grooves disposed between adjacent convex portions; and a flat layer, located on one side of the insulation layer away from the substrate, wherein a refractive index of the flat layer is lower than a refractive index of the insulation layer;

wherein the insulation layer comprises a first insulator layer and a second insulator layer, and each of the convex portions comprises a first convex portion corresponding to the first insulator layer and a second convex portion corresponding to the second insulator layer, a roughness of a side wall of the groove corresponding to the first convex portion is greater than a roughness of a side wall of the groove corresponding to the second convex portion;

wherein the difference in refractive index disposed between the insulating layer and the flat layer is greater than or equal to 0.3, and the difference in refractive index disposed between the insulating layer and the flat layer is less than or equal to 0.5.

19. The display panel as claimed in claim 18, wherein the flat layer is selected from a transparent organic material.

20. A display panel, comprising:

a substrate;

a light-emitting layer, located on one side of the substrate, comprising a plurality of pixel units;

an insulation layer, located on one side of the light-emitting layer away from the substrate, comprising a plurality of convex portions corresponding to a pixel unit and a plurality of grooves disposed between adjacent convex portions; and a flat layer, located on one side of the insulation layer away from the substrate, wherein a refractive index of the flat layer is lower than a refractive index of the insulation layer;

wherein the insulation layer comprises a first insulator layer and a second insulator layer, and each of the convex portions comprises a first convex portion corresponding to the first insulator layer and a second convex portion corresponding to the second insulator layer, a roughness of a side wall of the groove corresponding to the first convex portion is greater than a roughness of a side wall of the groove corresponding to the second convex portion;

wherein the first insulator layer is disposed between the substrate and the second insulator layer;

wherein the convex portion comprises a first surface near the substrate and a second surface far from the substrate;

wherein the first surface and the second surface intersect with the same perpendicular cross-section of the substrate to form a first intersection line and a second intersection line, and a length of the first intersection line is greater than a length of the second intersection line; and wherein a roughness of the second surface of a raised portion is less than a roughness of the side wall corresponding to the groove of a second raised portion.

* * * * *